United States Patent [19]

Wilcox

[11] Patent Number: 5,066,871
[45] Date of Patent: Nov. 19, 1991

[54] MAXIMUM SWING CASCODE CIRCUIT FOR A BIPOLAR CHARGE PUMP

[75] Inventor: Milton E. Wilcox, Saratoga, Calif.

[73] Assignee: National Semiconductor Corporation, Santa Clara, Calif.

[21] Appl. No.: 698,365

[22] Filed: May 9, 1991

Related U.S. Application Data

[63] Continuation of Ser. No. 433,505, Nov. 8, 1989, abandoned.

[51] Int. Cl.⁵ .................. H03K 3/01; H02M 3/18
[52] U.S. Cl. ...................... 307/296.1; 307/296.4; 307/110; 363/60
[58] Field of Search ............ 307/296.1, 296.4, 110; 363/60; 365/227

[56] References Cited

U.S. PATENT DOCUMENTS

| | | | |
|---|---|---|---|
| 3,002,114 | 9/1961 | Englund, Jr. ............... | 307/110 |
| 3,240,958 | 3/1966 | Kerios et al. ............... | 307/110 |
| 3,867,940 | 2/1975 | Schwalm et al. ............ | 307/110 |
| 3,878,450 | 4/1975 | Greatbatch ................. | 307/110 |
| 3,944,908 | 3/1976 | Oki .............................. | 363/60 |
| 3,962,591 | 6/1976 | Popka .......................... | 363/60 |
| 4,291,369 | 9/1981 | Hochstrate ................... | 363/60 |
| 34,997,832 | 12/1976 | Tanaka et al. .............. | 307/110 |

Primary Examiner—Stanley D. Miller
Assistant Examiner—Richard Roseen
Attorney, Agent, or Firm—Limbach, Limbach & Sutton

[57] ABSTRACT

A maximum swing bipolar charge pump retains a cascode switching configuration for high breakdown. The charge pump includes a charge pump capacitor with a first plate connected to supply in the conventional manner. A first cascode-connected NPN transistor is utilized to switch the second plate of the pump capacitor to the supply. A second cascode-connected NPN transistor is utilized to switch the second plate of the pump capacitor close to ground. An additional bipolar biasing network holds the second NPN transistor out of heavy saturation when the second plate of the pump capacitor is switched close to ground, thereby preserving fast turn-off time and maximum voltage swing with the constraint of a bipolar cascode configuration.

3 Claims, 2 Drawing Sheets

MAXIMUM SWING CASCODE CIRCUIT FOR A BIPOLAR CHARGE PUMP

This is a continuation of co-pending application Ser. No. 433,505 filed on 11/08/89 now abandoned.

BACKGROUND OF THE INVENTION

1. Field of the Invention

The present invention relates generally to electronic circuits and, in particular, to a bipolar charge pump switching circuit that transfers the maximum possible charge to the charge pump capacitor while retaining a cascode configuration for high breakdown.

2. Discussion of the Prior Art

Electronic systems often include circuits that require an operating voltage higher than the available supply. For example, some circuits in an automotive system require an input voltage that is higher than the 12 Volts available from a standard automobile battery. In these applications, a dedicated circuit is needed to "pump" the supply to the desired voltage level.

A simple schematic of a conventional charge pump circuit 10 is shown in FIG. 1. The circuit 10 consists, essentially, of a charge pump capacitor 12 that has one of its plates connected to the supply V+, shown as 12V in FIG. 1, and its other plate connectable to either ground or to the supply by switch 14. Initially, the switch 14 is in Position 1 which connects the bottom plate of the capacitor 12 to ground, causing the top plate of capacitor 12 to charge to the supply, i.e., 12V in the FIG. 1 example. Actually, the top plate of capacitor 12 may charge to slightly less than supply because of the 1 $V_{BE}$ drop across diode 16. After the top plate of capacitor 12 is fully charged, switch 14 is repositioned to Position 2, connecting the bottom plate of capacitor 12 to the supply. With the bottom plate of capacitor 12 now connected to the supply, the potential of the top plate increases by an additional V+. That is, nearly twice the supply is now available to be drawn upon by load 18 as needed, with diode 16 providing isolation for capacitor 12.

Typically, switch 14 is implemented in so-called MOS (metal-oxide-semiconductor) technology which provides crisp on-off switching capability and rail-to-rail voltage swing for charging the pump capacitor 12.

One simple and widely implemented CMOS (complimentary-metal-oxide-semiconductor) circuit configuration utilized in realizing switch 14 is the inverter 20 shown in FIG. 2. A square wave input to the gates of n-channel transistor 22 and p-channel transistor 24 causes the transistors 22 and 24 to alternately turn on to provide the switching action described above in conjunction with FIG. 1. The period of the square wave input may be chosen to provide a charging frequency for capacitor 12 sufficient to satisfy the demands of the load 18.

However, a major deficiency of these MOS switches is that, in some harsh operating environments, the breakdown voltages of the MOS transistors are insufficient for the transistors to withstand the high voltage transients. For example, in automotive systems, the possibility of inadvertent reverse battery conditions or loose battery cables has caused some automobile manufacturers to specify that integrated circuits utilized in these applications be capable of standing off up to 60V, well above the breakdown voltage of commonly available MOS transistors. Thus, additional protective circuitry is required to shield the MOS switching transistors from the transient voltage levels.

Lateral PNP bipolar transistors, as commonly constructed utilizing conventional integrated circuit fabrication processes, are rugged enough to withstand the high transients described above, and when combined with complementary vertical NPN bipolar transistors form a desirable switching technology for charge pumps.

While NPN transistors typically cannot stand off sufficiently high voltages individually, it is well known that high breakdown NPN structures can be obtained by stacking the NPN transistors in a so-called cascode configuration. NPN transistors tend to easily saturate, however, causing them to turn off slowly. This is inconsistent with the need for the high switching speeds required to maintain the desired charge level on the pump capacitor, which typically can only be as large as 20–40 pF given present integrated circuit fabrication technology. Therefore, to realize the high switching speeds, the NPN transistors must be kept out of saturation.

SUMMARY OF THE INVENTION

The present invention provides a maximum swing bipolar charge pump with high speed switching that retains a cascode switching configuration for high breakdown. The charge pump includes a charge pump capacitor with a first plate connected to the supply in the conventional manner. A first cascode-connected NPN transistor and PNP current mirror is utilized to switch the second plate of the charge pump capacitor to the supply. A second cascode-connected NPN transistor is utilized to switch the second plate of the charge pump capacitor close to ground. An additional biasing network holds the second NPN transistor out of heavy saturation when the second plate of the charge pump capacitor is switched close to ground, thereby preserving a fast turn-off time. Thus, the bipolar charge pump exhibits high switching speeds and the voltage swing available on the pump capacitor is maximized, all within the constraint of the bipolar cascode configuration.

The foregoing and additional features and advantages of the present invention will be more fully understood and appreciated upon consideration of the following detailed description of the invention, which should be considered in conjunction with the accompanying drawings.

DETAILED DESCRIPTION OF THE INVENTION

Figure 1:
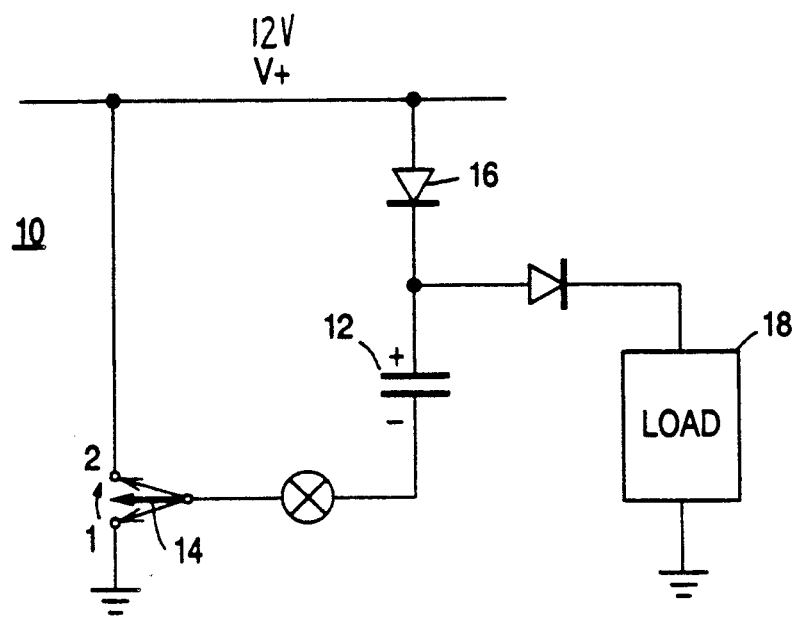
FIG. 1 is a simple schematic diagram illustrating a conventional charge pump circuit.
Figure 2:
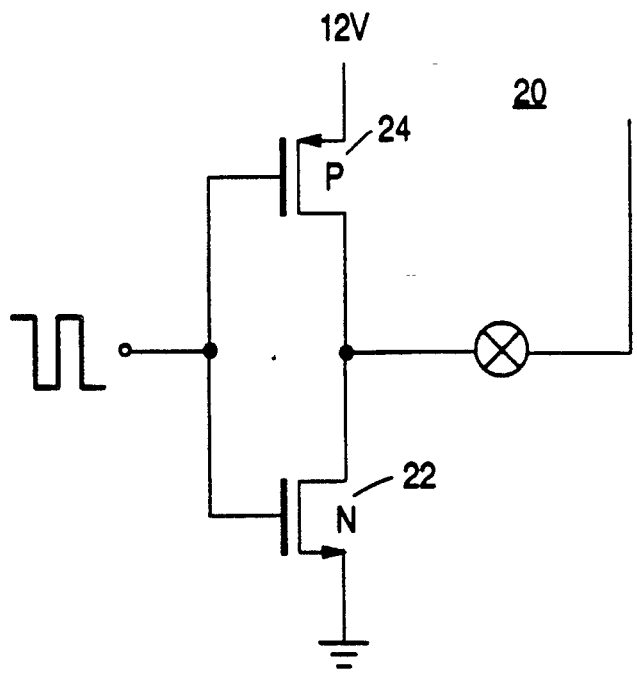
FIG. 2 is a schematic diagram illustrating a CMOS inverter circuit utilizable as a switch in the FIG. 1 charge pump circuit.
Figure 3:
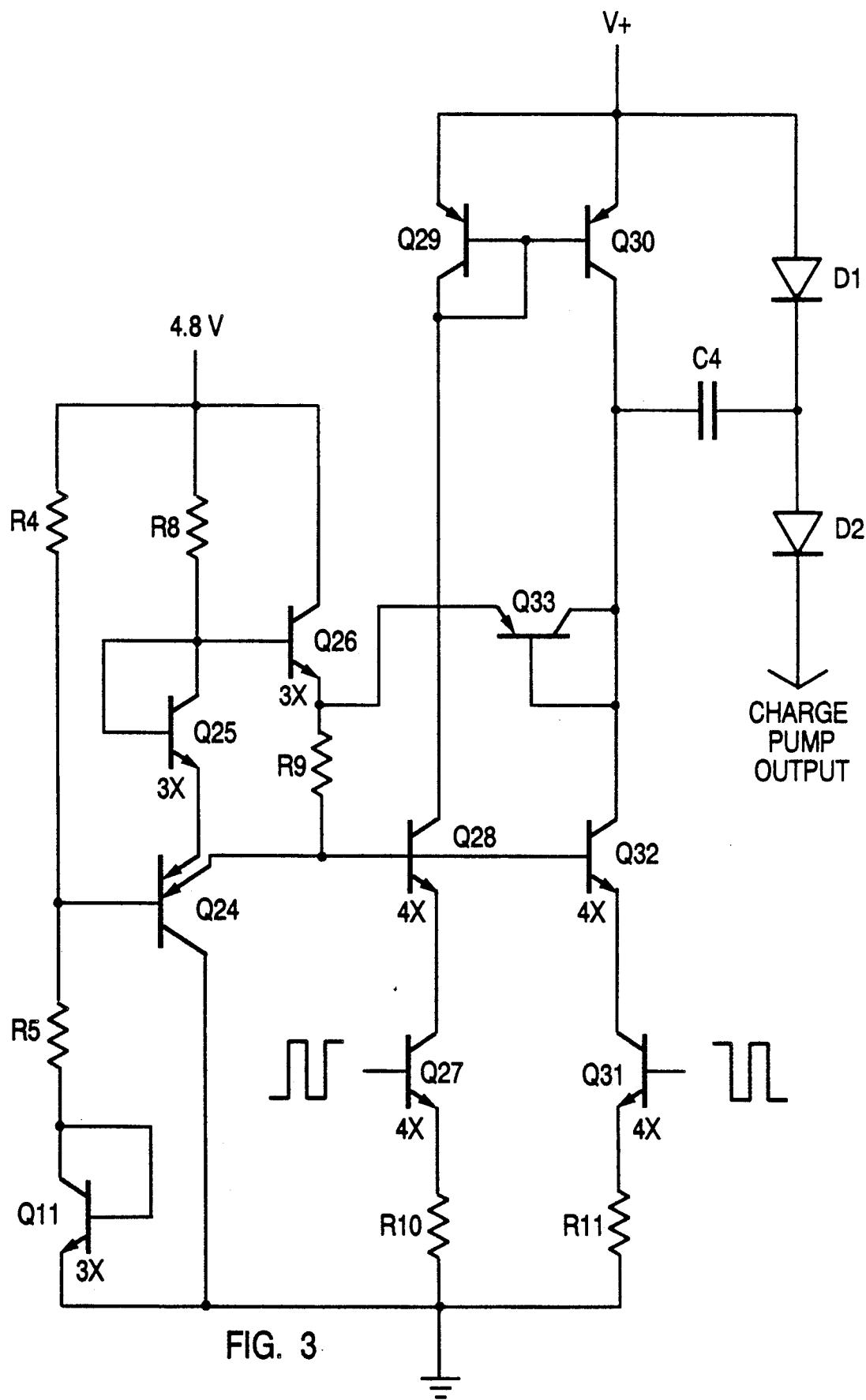
FIG. 3 is a schematic diagram illustrating a maximum swing cascode bipolar charge pump circuit in accordance with the present invention.

FIG. 3 provides a schematic diagram of an embodiment of a maximum swing cascode circuit for a bipolar charge pump in accordance with the present invention. The illustrated circuit can be implemented in integrated form using well known manufacturing processes.

As shown in FIG. 3, NPN transistors Q27 and Q31, each of which has a 4× emitter, are connected to circuit ground via 600 ohm resistors R10 and R11, respectively. The collectors of input transistors Q27 and Q31 are respectively connected to the 4× emitters of cascode NPN transistors Q28 and Q32. The collectors of transistors Q28 and Q32 are connected to a current mirror comprising PNP transistors Q29 and Q30.

Base drive for transistors Q28 and Q32 is provided by one of the matched emitters of dual emitter PNP transistor Q24. NPN bias transistors Q25 and Q26 receive their base drive from a 4.8V supply via 10 Kohm resistor R8. A PNP clamping transistor Q33 is connected between the emitter of bias transistor Q26 and the collector of cascode transistor Q32. 20 pF pump capacitor C4 has its bottom side connected between the collectors of transistors Q30 and Q32; the top side of capacitor C4 is connected to isolating diodes D1 and D2 which are connected between the supply and the charge pump output.

As shown in FIG. 3, NPN transistors Q27 and Q31 are driven with opposing square waves, creating currents which alternately flow through cascode transistors Q28 and Q32 to current mirror Q29, Q30. The collectors of transistors Q30 and Q32 switch the bottom side of the pump capacitor C4 between a low potential when cascode transistor Q32 is turned on and supply when cascode transistor Q28 and current mirror Q29, Q30 are turned on.

The base regions of transistors Q28 and Q32 are biased, via 13 Kohm resistor R4 and 1 Kohm resistor R5 and transistors Q11 and Q24, to as low a voltage as possible while still maintaining sufficient operating voltage for input transistors Q27 and Q31, thus maximizing the voltage swing on pump capacitor C4.

If, however, cascode transistor Q32 is allowed to saturate while switching pump capacitor C4 low, both an undesirable increase in current and a slow turn-off time would result due to the parasitic PNP action associated with the collector-base junction of cascode transistor Q32 turning on.

In accordance with the present invention, to hold NPN transistor Q32 just out of heavy saturation, so that pump capacitor C4 can swing to maximum low, an additional biasing network that includes NPN bias transistors Q25 and Q26 and PNP clamping transistor Q33 has been added. Due to the matching between the two emitters of transistor Q24 and between the 3× emitters of transistors Q25 and Q26, a well-defined $\Delta V_{BE}$ is present across 1 Kohm resistor R9. Clamp transistor Q33 is offset by this $\Delta V_{BE}$ voltage above the base of transistor Q32, thus increasing the collector voltage of transistor Q32 by $\Delta V_{BE}$ during clamping. Since the base-emitter junction of transistor Q33 and the collector-base junction of transistor Q32 have similar characteristics, the forward bias of the collector of transistor Q32 can be precisely maintained in a "soft saturation" region.

Transistors Q24 and Q26 provide low impedances in the desired directions; that is, dual emitter transistor Q24 sinks any leakage current from transistors Q28 or Q32, thus providing high breakdowns, while transistor Q26 sources the required clamping current through transistor Q33 to keep transistor Q32 out of heavy saturation. Until transistor Q32 saturates, it drains low base current, thus not affecting the voltage drop across resistor R9. If the collector/base junction of transistor Q32 begins to go into saturation, negative feedback via resistor R9 holds it out of saturation. Thus, the swing available on pump capacitor C4 has been maximized within the constraint of the bipolar cascode circuitry.

It should be understood that various alternatives to the embodiment of the invention described herein may be utilized in practicing the invention. It is intended that the following claims define the scope of the invention and that devices within the scope of these claims and their equivalents be covered thereby.

What is claimed is:

1. A bipolar charge pump that generates an output voltage greater than its supply voltage, the charge pump comprising:
   (a) a pump capacitor having a first plate connected to the supply voltage via a first diode and a second plate selectively connectable to the supply voltage or to ground;
   (b) a firsts NPN cascode transistor having a base, collector and an emitter;
   (c) a first NPN input transistor having a base, a collector and an emitter, the collector of the first input transistor connected to the emitter of the first cascode transistor to form a cascode connection therebetween, the emitter of the first input transistor connected to ground via first resistive element;
   (d) a second NPN cascode transistor having a base, a collector and an emitter, the collector of the second cascode transistor connected to the second plate of the group capacitor;
   (e) a second NPN input transistor having a base, a collector and an emitter, the collector of the second input transistor connected to the emitter of the second cascode transistor to form a cascode connection therebetween, the emitter of the second input transistor connected to ground via a second resistive element;
   (f) a current mirror comprising first and second PNP current mirror transistor, each current mirror transistor having a base, a collector and an emitter, the base of the first current mirror transistor connected to the base of the second current mirror transistor, the base of the first current mirror transistor connected to the collector of the first current mirror transistor, the emitter of the first current mirror transistor connected to the supply voltage, the collector of the second current mirror transistor connected to the second plate of the pump capacitor, the emitter of the second current mirror transistor connected to the supply voltage;
   The base of the first input transistor and the base of the second input transistor being responsive to first and second opposing square waves, respectively, for causing current to alternately flow through the first cascode transistor and the second cascode transistor to the current mirror thereby switching the second plate of the pump capacitor between a low potential when the second cascode transistor is turned on and the supply voltage when the first cascode transistor and the current mirror are turned on; and
   (g) a biasing network connected to the collector of the second cascode transistor for preventing the second cascode transistor from saturating when the second plate of the pump capacitor is switched to the low potential.

2. A bipolar charge pump as in claim 1 wherein the biasing network comprises:
   (a) a dual emitter transistor having a base, a collector, and matched first and second emitters, and connected to provide base drive to the first and second cascode transistors from one of its matched first and second emitters;

(b) first and second bias transistors, each have a base, collector and an emitter, the emitters of the first and second bias transistors being matched, the base of the first bias transistor connected to the base of the second bias transistor, the emitter of the first bias transistor connected to the base of the second cascode transistor via a fourth resistive element; and (c) a clamping transistor connected between the emitter of the first bias transistor and the collector of the second cascode transistor.

3. A bipolar charge pump as in claim 2 and further including:

(a) a fifth resistive element connected between the bias supply and the base of the dual emitter transistor; and (b) a third bias transistor having a base, a collector and an emitter, the base of the third bias transistor connected to the collector of the third bias transistor and said emitter being connected to ground; and (c) a sixth resistive element connected between the base of the dual emitter transistor and the collector of the third bias transistor.

* * * * *